(12) United States Patent
Guimond et al.

(10) Patent No.: US 9,840,779 B2
(45) Date of Patent: Dec. 12, 2017

(54) DECORATIVE, JET-BLACK COATING

(71) Applicant: Oerlikon Surface Solutions AG, Trübbach, Trübbach (CH)

(72) Inventors: Sebastien Guimond, St. Gallen (CH); Manfred Wurzer, Wittenbach (CH); Franz Widowitz, Feldkirch (AT)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 47 days.

(21) Appl. No.: 14/769,449

(22) PCT Filed: Feb. 10, 2014

(86) PCT No.: PCT/EP2014/000355
§ 371 (c)(1),
(2) Date: Aug. 20, 2015

(87) PCT Pub. No.: WO2014/127890
PCT Pub. Date: Aug. 28, 2014

(65) Prior Publication Data
US 2016/0002792 A1 Jan. 7, 2016

(30) Foreign Application Priority Data
Feb. 21, 2013 (DE) .................. 10 2013 002 911

(51) Int. Cl.
*B32B 7/02* (2006.01)
*C23C 28/04* (2006.01)
(Continued)

(52) U.S. Cl.
CPC .......... *C23C 28/048* (2013.01); *C23C 14/345* (2013.01); *C23C 16/006* (2013.01);
(Continued)

(58) Field of Classification Search
None
See application file for complete search history.

(56) References Cited

U.S. PATENT DOCUMENTS 5,900,289 A 5/1999 Hartmann et al.
2007/0037014 A1 2/2007 Nagata
(Continued)

FOREIGN PATENT DOCUMENTS

DE 29605666 U1 5/1996
DE 19544498 A1 6/1996
(Continued)

OTHER PUBLICATIONS

Z. Sun, et al., "Properties and Structures of Diamond-Like Carbon Film Deposited Using He, Ne, Ar/Methane Mixture by Plasma Enhanced Chemical Vapor Deposition," J. Appl. Phys., Jun. 1, 2000, pp. 8122-8131, vol. 87, No. 11.
(Continued)

*Primary Examiner* — David Sample
*Assistant Examiner* — Nicole T Gugliotta

(57) ABSTRACT

A jet-black coating that resists wear; first, at least one DLC layer with a high degree of hardness is applied to a component and then a gradient layer, whose density decreases in the direction toward the surface, is applied to this DLC layer. By means of the refraction index progression that this produces in the gradient layer, the gradient layer functions as a reflection-reducing layer.

5 Claims, 1 Drawing Sheet

(51) Int. Cl.
*C23C 16/00* (2006.01)
*C23C 16/02* (2006.01)
*C23C 16/26* (2006.01)
*C23C 16/455* (2006.01)
*C23C 14/34* (2006.01)
*C23C 16/513* (2006.01)

(52) U.S. Cl.
CPC .......... *C23C 16/0272* (2013.01); *C23C 16/26* (2013.01); *C23C 16/45523* (2013.01); *C23C 16/513* (2013.01); *C23C 28/046* (2013.01)

(56) References Cited

U.S. PATENT DOCUMENTS

2008/0264476 A1   10/2008   Sharps et al.
2014/0335335 A1*  11/2014   Koch, III ............... G02B 1/105
                                                                                                428/213

FOREIGN PATENT DOCUMENTS

| DE | 19825983 A1 | 3/1999 |
|---|---|---|
| DE | 19825860 A1 | 12/1999 |
| DE | 102005063123 B3 | 5/2007 |
| DE | 102008011921 A1 | 9/2009 |
| EP | 1362931 B9 | 11/2003 |
| JP | 2007046115 A | 2/2007 |
| JP | 2012518089 A | 8/2012 |
| WO | 0047290 A1 | 8/2000 |
| WO | 2010095011 A1 | 8/2010 |

OTHER PUBLICATIONS

G.F. Zhang, et al., "Studies on Diamondlike Carbon Films for Antireflection Coatings of Infrared Optical Materials," J. Appl. Phys., Jul. 15, 1994, pp. 705-707, vol. 76, No. 2.

M. Stüber, et al., "Graded Layer Design for Stress-Reduced and Strongly Adherent Superhard Amorphous Carbon Films," Surface and Coatings Technology, 1999, pp. 591-598, vol. 116-119.

G.F. Zhang, et al., "Influence of Deposition Parameters on the Refractive Index and Growth Rate of Diamond-Like Carbon Films," Surface and Coatings Technology, 1994, pp. 127-130, vol. 64.

* cited by examiner

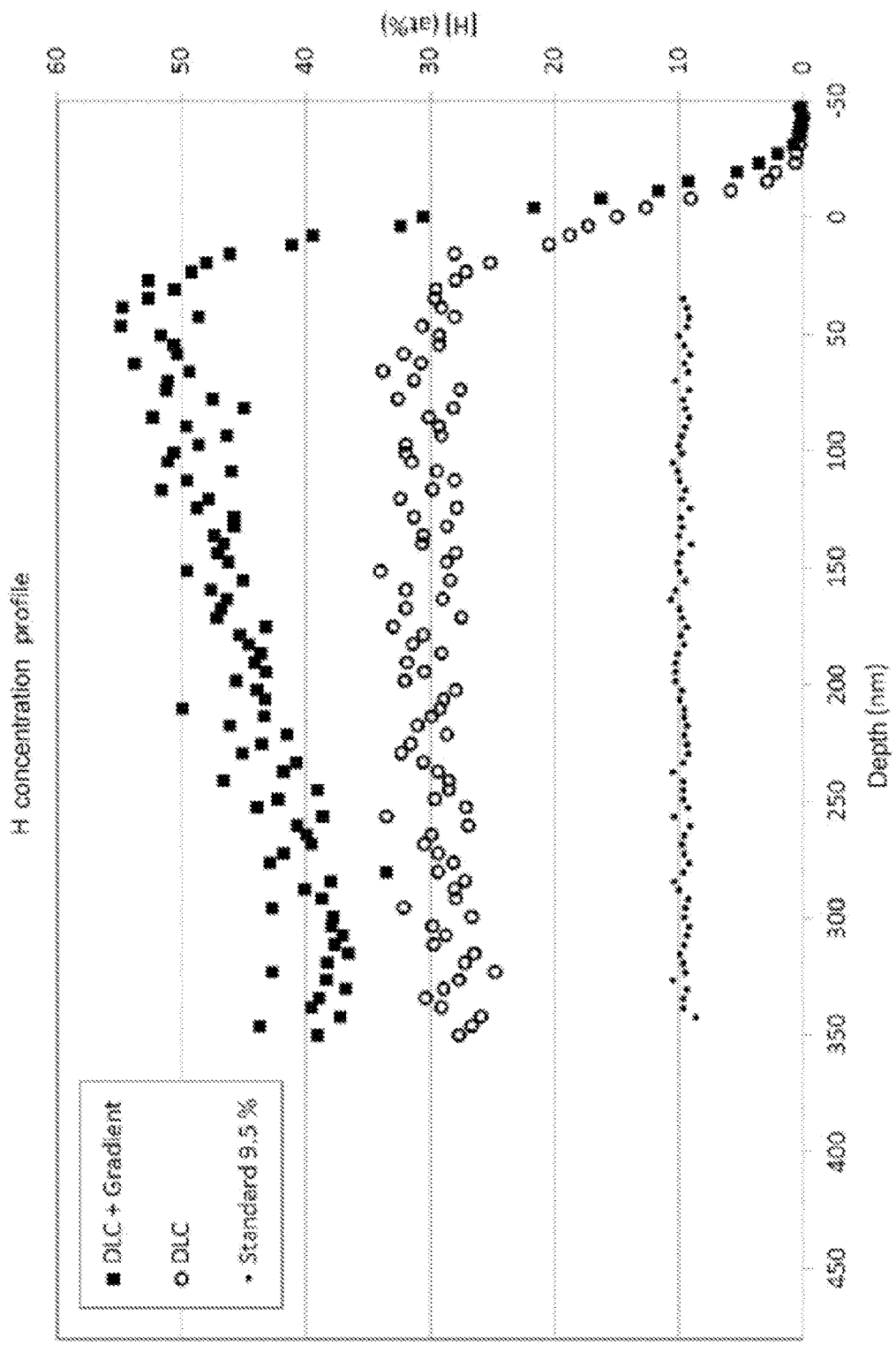

DECORATIVE, JET-BLACK COATING

FIELD OF THE INVENTION

The present invention relates to a method for producing a wear-resistant layer for decorative applications with a jet-black appearance.

BACKGROUND OF THE INVENTION

There is considerable need for surfaces with a black appearance, for example in the field of consumer articles such as watch cases, mobile phones, or bumpers on motor vehicles. In such applications, however, the outer, preferably jet-black or deep black appearance is not the only thing that is important; the resistance to external mechanical impacts is important, too. In particular, the surface should be scratch-resistant.

The German application DE3639469 describes a hard material layer with a decorative black appearance, which simultaneously has a high wear resistance. This hard material layer includes a first layer composed of an element from the groups IVa and Va of the periodic table of elements, a second layer that includes a nitride of this element of the first layer, a third layer that contains a carbide of the element, and a covering layer composed of a hard carbon layer, with carbide crystallites of the same element being embedded in this covering layer.

It is also known to use DLC layers. These have a black appearance and a high degree of hardness. However, conventional DLC layers have neutral gray values (L*=lightness) that lie in the range above 40. In this case and in the present description, the CIE 1976 L*a*b* color space, which is based on D65 standard lighting and a d/8° (=diffuse lighting, and measurement at under 8°), is taken as a basis. In connection with the present description, surfaces are considered to be jet-black surfaces if they have a neutral gray value L*=<40.

The black appearance of DLC layers is produced by its high absorption capacity. This is a result of the relatively high absorption coefficient of the material. This absorption coefficient, however, is accompanied by a high refractive index of between 2.1 and 2.3. As a result of this, when light strikes the surface of the DLC coating, a large jump in the refractive index, at the transition from air (n=1) into the layer causes a significant portion of the light to be reflected, thus resulting in a high L* value.

At this point, it would be possible to provide an optical anti-reflection layer on this surface. Such layers, however, are based on the principle of interference. Their reflection behavior is consequently on the one hand dependent on wavelength and on the other hand also dependent on the angle of incidence. In addition, the reflection behavior of such layers is highly dependent on the layer thickness produced. This can lead to significant problems, primarily when the geometries of components to be coated are not planar.

There is thus a need for a hard surface coating that produces a jet-black visual appearance that is preferably independent of the viewing angle.

The object of the present invention, therefore, is to disclose a hard surface coating that produces a jet-black visual appearance that preferably remains independent of the viewing angle.

SUMMARY OF THE INVENTION

The layer system produced according to the present invention features a lower L* value than a conventional DLC layer. This is achieved in that a gradient layer with a decreasing density and therefore a decreasing refractive index is produced on a DLC layer. With a sufficient thickness of the gradient layer, this achieves a reduction of the Fresnel reflection on the surface. For example, the reflection of a conventional DLC surface with $n_{DLC}$=2.3 and a perpendicular incidence of light is approximately 16%. This yields an L* value of approximately ca. 47. By contrast, the reflection of a surface with n=1.7 and a perpendicular incidence of light is only 7%. Because of the increasing refractive index produced in the gradient layer, Fresnel reflection essentially no longer occurs within the gradient layer and at the transition to the DLC layer. Consequently, the L* value is only 32.

It is clear here that due to the lower and decreasing density of the gradient layer, this leads to a reduction in the overall hardness of the layer. In a preferred embodiment, the gradient is implemented so that the overall hardness of the layer is not less than 15 GPa.

According to another preferred embodiment of the present invention, the DLC layer has a refraction index of between 2 and 3 and/or a neutral gray value L* of between 40 and 60, more preferably between 45 and 55.

According to another preferred embodiment of the present invention, the DLC layer has a hardness that is not less than 1500 HV or 15 GPa, preferably not less than 18 GPa, and even more preferably not less than 20 GPa.

According to another preferred embodiment of the present invention, within the gradient layer thickness, there is no region that has a hardness of less than 600 HV or 6 GPa, preferably not less than 8 GPa.

According to another embodiment of the present invention, the thickness of the DLC layer is not less than 0.5 µm.

According to another embodiment of the present invention, the thickness of the gradient layer is not less than 300 nm.

A coating according to the present invention can, for example, manufactured by means of plasma-supported CVD processes, PVD processes, or a combination of the two.

A preferred embodiment of the present invention for manufacturing layers includes a combined plasma-supported CVD and sputtering process.

The coating according to the present invention has the following advantages, among others:

The DLC layer remains hard enough in order to ensure wear resistance. If the somewhat softer gradient layer is scratched, then at least the underlying DLC layer remains intact and, since this underlying layer is also black, the scratch will be hardly noticeable.

On substrates with an increased roughness, it is even possible to increase the wear resistance of the gradient layer since the regions between the peaks of substrate material are protected.

Because the effect of reflection reduction is not based on interference effects, the layer thickness dependence and angle dependence of the reflection are sharply reduced.

The gradient layer can be manufactured using conventional systems for manufacturing the DLC layer. No additional equipment or additional gases are required.

The invention will now be explained by way of example in conjunction with a detailed description of the process.

BRIEF DESCRIPTION OF THE DRAWINGS

FIG. 1 shows the hydrogen concentration of different DLC samples in comparison to a reference.

DETAILED DESCRIPTION OF THE PREFERRED EMBODIMENTS

The substrates were produced in a vacuum chamber by means of a plasma-supported CVD method; a combination of acetylene and argon is used as the process gas. The process gas was ionized in the chamber by means of a plasma, which was produced by means of a low-voltage arc discharge. In addition, a substrate bias was applied to the substrates during the coating process.

In order to coat the DLC layer, the substrate bias was kept at a constant value of 900 V. The DIX coating took 80 minutes. In order to coat the gradient layer, the substrate bias was continuously reduced from 900 V to 50 V. After the passage of 40 minutes, a substrate bias of 50 V was reached. Aside from the substrate bias, the other coating parameters were kept constant during the entire coating process. Preferably, however, the low-voltage arc discharge current is continuously increased in order to counteract the decrease in the substrate current that occurs with a reduction of the substrate bias. This continuous reduction of the substrate bias produced a continuous reduction in the layer density, which in turn yielded a reduction in the refraction index.

As a result, the gradient layer was 0.7 μm thick. The microindentation hardness for the entire system (DLC layer and gradient layer), measured at a load of 10 mN on a Fischerscope, was 18 GPa. The measured value L* was 35. This would correspond to a refraction index of n=1.85 at the surface. In addition, the green/red factor a* and the yellow/blue factor b* were measured in accordance with the definition of the Lab color space. For a*, a value of −0.5±1 was measured and for b*, a value of 1±1 was measured. The layer system demonstrated an excellent wear resistance.

The refraction index of the gradient layer cannot be arbitrarily reduced because it has a direct influence on the overall hardness of the layer. But because the reflection-reducing effect of the gradient layer is not based on interference effects, it is possible, once the lowest refraction index to be produced is achieved, to continue coating the gradient layer with this refraction index. In the preceding example, upon achievement of a substrate bias of 50 V, the coating procedure could be continued for 20 minutes while maintaining this bias value, without further increasing, the reflection.

The example illustrated in the description related to a gradient layer whose composition essentially corresponds to that of the DLC layer. It is also possible, however, to achieve a lower optical density in that after the application of the DLC layer, another chemical element or several other chemical elements can be added with increasing concentration as the coating procedure continues while at the same time, the concentration of the carbon decreases, in the extreme case, the carbon content can be zero at the surface. Silicon or SiOx where x>=0 are mentioned by way of example. For example, if the procedure is carried out so that starting from the DLC layer, an increase in the SiOx content occurs, possible also with variation of x—for example from x=0 at the "boundary surface" with the DLC layer to x=2 at the surface—then at the surface, an SiO2 layer can be provided, which has a refraction index of 1.5. In this case, only 4% of perpendicularly incident light is reflected.

A depth profile of the concentration of hydrogen atoms ([H]) was determined for 2 DLC samples with 2 MeV He ERDA (elastic, recoil detection analysis): one with a gradient and one without. in order to calculate the data, a standard with 9.5 at % H (mica) was measured as a reference and the energy loss (braking power) of the alpha particles in the DLC layers and in the standard was determined with the SRIM program (www.srim.org). The coating of the DLC layer without the gradient was carried out with a constant substrate bias of 900 V and took 80 minutes (layer thickness ~1 μm). In order to coat the DLC layer with gradient, the substrate bias was continuously reduced from 900 V to 50 V. This step took 80 minutes and resulted in a gradient layer thickness of 1.5 μm. The results are plotted in FIG. 1. This method makes it possible to measure down to a depth of approximately 350 nm. The surface is depicted in the profile at the right (0) and the depth scale increases toward the left. The results show that the concentration of hydrogen atoms increases toward the gradient surface. In the DLC sample without a gradient, however, the concentration of hydrogen atoms remains constant.

The wear resistance of the DLC sample with the gradient layer was examined using an applied testing method that is based on the "Crockmaster" abrasion testing device from James Heal (http://www.james-heal.co.uk/). In this method, a coated sample was abraded with a 1 cm×1 cm piece of abrasive paper (3M 281Q Wetordry, with 9-μm Al2O3 particles). The device moves the abrasive paper back and forth with a frequency of 1 Hz on the jet-black DIE-coated sample. A 9N load is exerted on the abrasive paper and the abrasive paper is replaced after 500 back-and-forth cycles. After 6000 cycles, no significant change in the color values (L*, a*, and b*) and no traces of scratching, were discernible. In comparison to this, jet-black (L*35) TiAlCN PVD layers tested under the same conditions already showed significant wear after only 1000 cycles.

The invention claimed is:

1. A hard material layer, on a component, the hard material layer comprising:
    a diamond-like carbon (DLC) layer with a hardness of at least 10 GPa and a refraction index $n_{DLC}$ of $n_{DLC}>2.1$; and
    a separate gradient layer on top of the DLC layer, wherein the gradient layer is at least 300 nm thick and is produced on the DLC layer as a gradient layer with a decreasing density and therefore a decreasing refractive index, resulting in a refraction index gradient, wherein an averaged refraction index of the gradient layer determined as an average along 30 nm adjacent to an interface with the DLC layer, is, greater than or equal to 2.0, and wherein an averaged refraction index of the gradient layer determined as an average along 30 nm adjacent to an outer surface opposite the DLC layer, does not exceed 1.85.

2. The hard material layer according to claim 1, wherein a chemical composition of the gradient layer differs from a chemical composition of the DLC layer essentially only with regard to hydrogen content.

3. The hard material layer according to claim 1, wherein the refraction index gradient yields a steadily decreasing refraction index in the gradient layer from the DLC layer toward the outer surface.

4. The hard material layer according to claim 1, wherein a thickness of the gradient layer is selected so that the surthce is jet-black in appearance.

5. A method for manufacturing the hard material layer of Claim 1, the method comprising:
    loading a coating chamber with substrates that are to be coated;
    pumping-out the coating chamber and introducing a process gas including acetylene and argon;
    producing a plasma using low-voltage arc discharge; and applying a substrate bias to the substrates that are to be coated, wherein in order to deposit a DLC layer, first a high substrate bias is applied and for the subsequent coating of a gradient layer, the substrate bias is reduced continuously and/or with a plurality of small reduction steps.

* * * * *